Figure 1:
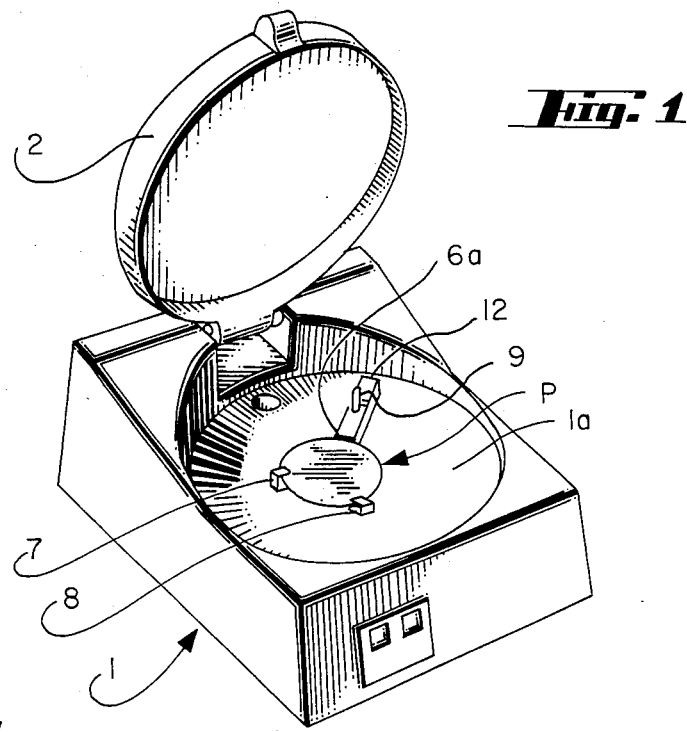

United States Patent [19]
Poli et al.

[11] Patent Number: 4,724,619
[45] Date of Patent: Feb. 16, 1988

[54] SINGLE WAFER CENTRIFUGAL DRYER

[75] Inventors: Bernard Poli, Roche la Moliere; Gérard Chincholle, Saint.Etienne, both of France

[73] Assignee: Recif (Societe Anonyme), France

[21] Appl. No.: 940,536

[22] Filed: Dec. 10, 1986

[30] Foreign Application Priority Data
Dec. 10, 1985 [FR] France .................. 85 18637

[51] Int. Cl.⁴ .................................. F26B 11/22
[52] U.S. Cl. .................................. 34/58; 34/8; 34/184
[58] Field of Search .......... 34/8, 58, 184, 187

[56] References Cited
U.S. PATENT DOCUMENTS
4,313,266  2/1982  Tam .............................. 34/8
4,637,146  1/1987  Motoki et al. ............... 34/58

*Primary Examiner*—Larry I. Schwartz
*Attorney, Agent, or Firm*—Eric P. Schellin

[57] ABSTRACT

The device according to this invention comprises a casing in which turns a device designed to support and hold the wafer, the said device is fitted eccentrically with respect to its rotational pin (3) a support element 5-6 designed to hold the silicon wafer by its edges in a horizontal plane, the device assembly being mounted in stable balance with respect to the said pin.

5 Claims, 3 Drawing Figures

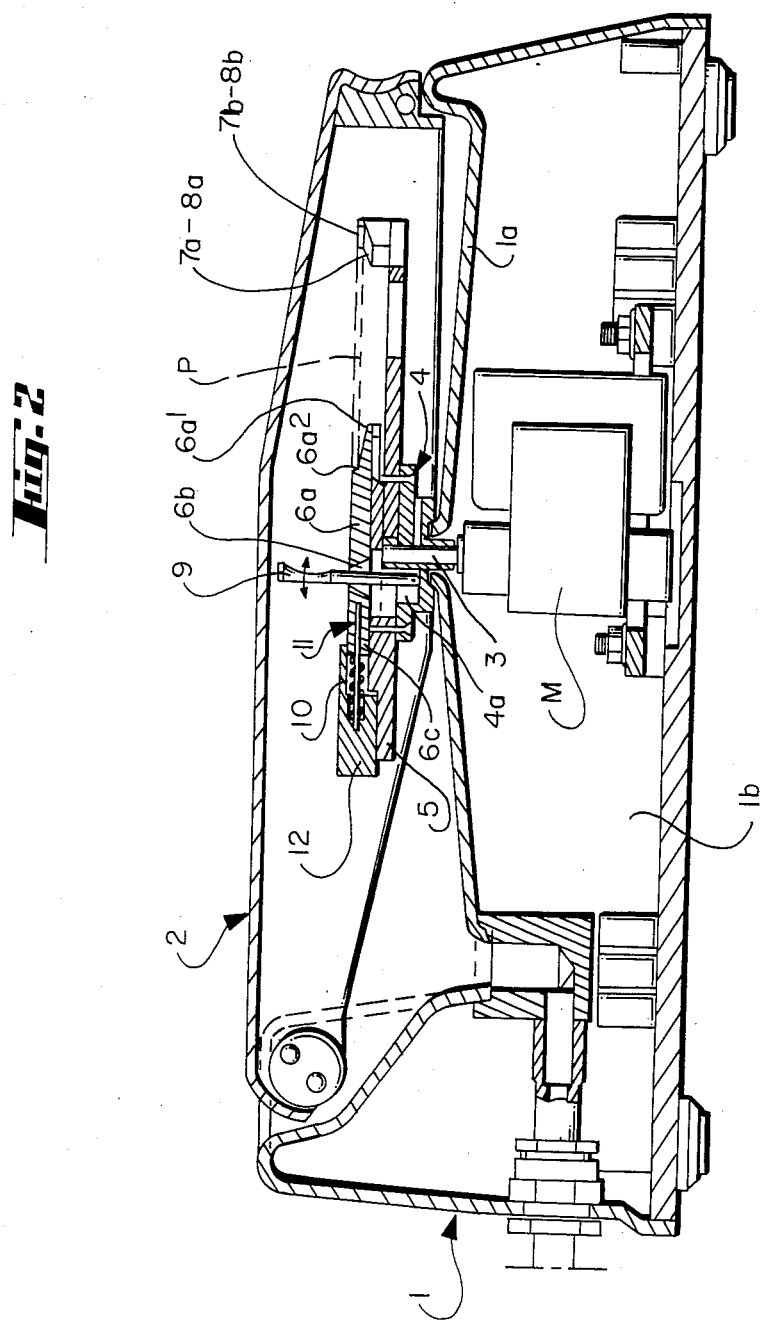

SINGLE WAFER CENTRIFUGAL DRYER

This invention relates to a single wafer centrifugal dryer.

This invention relates to the technical sectors for drying devices and microelectronics.

The drying of silicon wafers is known, particularly devices using centrifugal force. The wafer is placed on a turning support, whilst being concentrically positioned to the rotational axis and drive of the said support.

Some problems with the disposal of particles arise due to the positioning of the wafer. In fact, in the centre, the velocity and the centrifugal force are nil or almost nil so that it is necessary use a nitrogen jet or suchlike to dispose of the particles which have a tendency to accummulate in the centre. Another problem exists, with this type of wafer holding device. In general, the wafer is held by a system of weights which, as the said wafer is rotated, come into contact with its circumference. High breaking risks arise if the weights are badly positioned with respect to the edges of the wafer. In the same way, before being driven, the wafer is not held but simply laid flat. The object of this invention is to remedy these disadvantages by creating a device which designed to achieve primarily the following objectives, i.e.:

avoid generating particles,
reliability
profitability

With this in view, the device comprises a casing in which turns a device formed to support and hold the wafer, the device is fitted eccentrically with relation to its rotational pin, a support element designed to hold the silicon wafer by its edges in a horizontal plane, the device assembly being mounted in stable balance with respect to the said pin.

Figure 3:
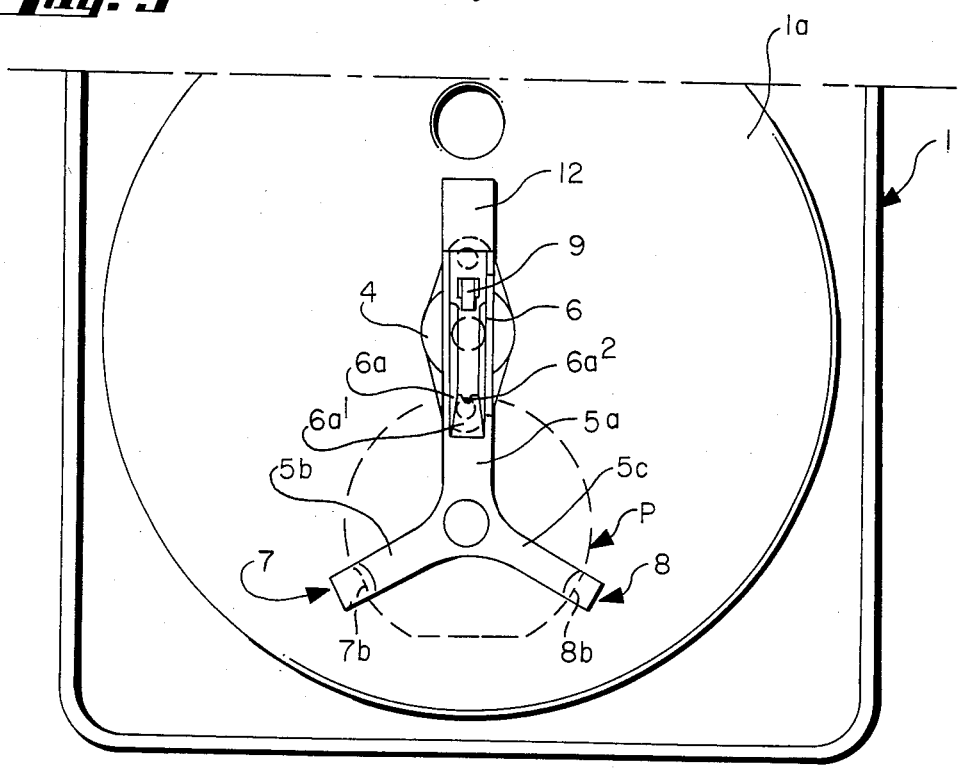

These and other specific objects will appear as the specification proceeds. In order to clarify the object of the invention, however, without limiting it, the invention is illustrated by the accompanying drawings, in which:

FIG. 1 is a perspective view of the device,
FIG. 2 is a longitudinal sectional view of the device,
FIG. 3 is a plan view of the device.

In order to concretise the object of this invention, it is now described as a non limitive embodiment as illustrated in the accompanying drawings. The device comprises a casing (1) with an internal compartment (1b) in which a mechanism is mounted, generally referred to by (M), to drive in rotation a device destined to take the silicon wafer (P) with a view to its centrifugal drying.

The device is projecting from the compartment (1b) particularly in a recess (1a) pluggable at will by a protective cover (2) suitably hinged on the said casing. For this purpose, the mechanism (M) is provided with a vertical rotational pin (3), the part of which projects in the recess (1a) is integral to a stepped coupling ring (4). On this ring, a support element is fixed and designed to eccentrically take the wafer with a view to its holding by the edges, in a horizontal plane.

As shown in FIG. 2, the ring (4) is fitted with a fixed support shoe (5) formed of a rectilinear centre arm (5a) extended at one of its ends by two angular and symmetric arms (5b) and (5c), the said arms being regularly offset by 120 degrees. The centre arm (5a) wider than the arms with angular ends (5b) and (5c), takes a free sliding part (6) the end of which (6a) is situated beyond the rotational pin (3) is suitably profiled to allow, in combination with the end pieces (7) and (8) fixed to the end of each arm (5b) and (5c), the positioning and the holding of the silicon wafer (P). The whole of the end pieces (7) and (8) and the end (6a) of the slider (6) therefore, defines a circular and flat supporting and positioning area which is eccentric with respect to the pin (3). The end (6a) is formed by a ramp (6a1) the top part of which is connected to a narrow support face (6a2). In a corresponding manner, each end piece (7) and (8) is formed by a ramp (7a) and (8a) which is connected at the top part with a support face (7b) and (8b). Note that the support faces (7b) and (8b) have a convex profile so as to have only a point contact with the wafer.

The translatory motion of the part (6) is controlled by means of a vertical drive finger (9) hinged at the bottom in a corresponding part forming a yoke (4a) of the coupling ring (4). This finger is inserted through a hole (6b) and abuts against the latter with limited rotation in a opening made out in the thickness of the centre arm (5a).

The part (6) is automatically returned into position by an elastic element (10) such as a spring mounted on a guide rod (11) and inserted into a housing formed in a block (12) machined directly or built up to the back part of the said part (6). The guide rod (11), integral with the back block (12), cooperates with a hole (6c) drilled axially in the back part of the part (6) in view to its sliding with respect to the said rod.

Note that the front part of the slider (6) is not in contact with the centre arm (5a) but leaves a very slight play thereby avoiding any risk of contamination by micro-particles likely to result from the relative movement of the slider with respect to the shoe (5).

The positioning of the silicon wafer (P), is carried out in the following manner: the wafer having been previously gripped by the vacuum handling system for example, the operator places it in front of end pieces (7) and (8) and the part (6a) of the slider (6) which is simultaneously very slightly cleared to the back by the operator who manually acts on the finger (9) thus allowing the passage and the positioning of the said wafer. Next, it is sufficient to release the finger (9) which results in automatically returning the slider (6) into position by spring back of the spring (10).

The wafer is then positioned eccentrically with respect to the rotational pin (3) and thus, is subjected to total centrifugal force so that the particles are completely removed. Note that the bottom of the recess (1a) is suitably profiled and sloped so as to dispose of the particles in combination with a device (1a1).

It is readily apparent that the device is equipped with various electronic control safety elements. For example, the support device can only be driven in rotation once the cover is closed. In addition, the device is equipped with an emergency stop and a safety stop when the cover is opened. The braking of the device after the preset rotation time necessary, is carried out completely electronically to avoid any risk of particles appearing, likely to be generated by rubbing of mechanical parts.

The support device assembly is perfectly statically and dynamically balanced. The advantages will become more apparent from the description, but the following features are more particularly underlined:

the loading and unloading facility of the wafer which is perfectly held by the edges both in the resting and working position, the eccentric position of the wafer allowing total drying of the front and back faces, small dimensions, reliable operation.

As guidance the coupling ring and the shoe (5) are made of hard anodised aluminium alloy, the slider and the end pieces are of hard plastic like that known as DELRIN.

The invention is in no way limited to the type of application or embodiments discussed herein; but it is to be understood that many variations and modifications will readily occur to those skilled in the art and are intended to be included within the scope of the invention.

What is claimed:

1. Apparatus for the drying of semi-conductor wafers by means of centrifugation, comprising a housing in which a support means is rotatingly mounted, said support means is and constructed so as to fixedly support said wafer and to rotate said wafer in an eccentric manner in relation to its axis of rotation, retaining means on said support means adapted and constructed to hold the semiconductor wafer by its edge in a horizontal plane, whereby the entire apparatus is mounted in a stable equilibrium in relation to said axis, said retaining means includes a generally Y-shaped support shoe composed of a center arm and two angular and symmetric arms, said centre arm has a slide having limited displacement and an end extending beyond the said axis of rotation, a pin fixed at the end of each of the angular and symmetric arms, said slide is adapted and constructed so as to permit in combination with said pins means for maintaining and positioning of said wafer.

2. Apparatus according to claim 1, wherein the pin means and the said end of the slide define a circular zone of a plane of support and of positioning which is eccentric in relation to the said axis.

3. Apparatus according to claim 1, wherein the slide is subjected to a vertical finger means in order to be displaced linearly in translation upon contacting an elastic return part in order to vary the spacing between the end of said slide and the pin means in order to facilitate the loading and unloading of a wafer.

4. Apparatus according to claim 1, wherein the support and positioning end is formed by a ramp whose top part is connected to a support plane face of reduced width and in a corresponding manner, pin means is formed by a ramp connected at the top to support face means.

5. Apparatus according to claim 4, the support face means and has a convex profile.

* * * * *